United States Patent
Guan et al.

(10) Patent No.: US 9,993,950 B2
(45) Date of Patent: Jun. 12, 2018

(54) IMPRINT TEMPLATE, DETECTION METHOD AND DETECTION DEVICE

(71) Applicant: BOE TECHNOLOGY GROUP CO., LTD., Beijing (CN)

(72) Inventors: Feng Guan, Beijing (CN); Jikai Yao, Beijing (CN); Yingtao Wang, Beijing (CN); Xiaolong He, Beijing (CN); Tingting Zhou, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days. days.

(21) Appl. No.: 15/650,016

(22) Filed: Jul. 14, 2017

(65) Prior Publication Data
US 2018/0021987 A1 Jan. 25, 2018

(30) Foreign Application Priority Data
Jul. 25, 2016 (CN) .......................... 2016 1 0591504

(51) Int. Cl.
G03B 17/24 (2006.01)
B29C 37/00 (2006.01)
G03F 7/00 (2006.01)
B81C 1/00 (2006.01)
B29C 43/00 (2006.01)

(52) U.S. Cl.
CPC ........ *B29C 37/0053* (2013.01); *B29C 43/003* (2013.01); *B81C 1/0046* (2013.01); *G03F 7/0002* (2013.01); *G03B 2217/242* (2013.01)

(58) Field of Classification Search
USPC ................... 396/315; 355/78, 112
See application file for complete search history.

(56) References Cited

U.S. PATENT DOCUMENTS

| | | | |
|---|---|---|---|
| 7,690,912 B2* | 4/2010 | Tokita | B81C 99/009 264/447 |
| 7,815,430 B2* | 10/2010 | Terasaki | B29C 35/0888 425/171 |
| 2006/0157444 A1* | 7/2006 | Nakamura | B82Y 10/00 216/54 |
| 2006/0266244 A1* | 11/2006 | Kruijt-Stegeman | B41F 1/18 101/485 |
| 2007/0176320 A1* | 8/2007 | Nakamura | B82Y 10/00 264/219 |
| 2007/0247608 A1* | 10/2007 | Sreenivasan | B82Y 10/00 355/75 |
| 2009/0304992 A1* | 12/2009 | Desimone | B82Y 10/00 428/141 |
| 2012/0027998 A1* | 2/2012 | Ibn-Elhaj | G02B 5/1857 428/161 |

(Continued)

*Primary Examiner* — Rodney Fuller
(74) *Attorney, Agent, or Firm* — Brooks Kushman P.C.

(57) ABSTRACT

An imprint template includes a first region and a second region located in the periphery of the first region. The first region is provided with a first imprint structure configured to imprint a first film layer pattern into a base material in a product region of a target substrate. The second region is provided with a second imprint structure configured to imprint a second film layer pattern into the base material in the periphery of the product region of the target substrate. And the second film layer pattern is used for assessing imprint quality of the first film layer pattern.

20 Claims, 3 Drawing Sheets

(56) References Cited

U.S. PATENT DOCUMENTS

| | | | | |
|---|---|---|---|---|
| 2012/0028378 A1* | 2/2012 | Morinaga | ............. | G03F 7/0002 |
| | | | | 438/14 |
| 2015/0221501 A1* | 8/2015 | Tsuji | .................... | G03F 7/0002 |
| | | | | 264/447 |
| 2016/0146984 A1* | 5/2016 | Jiang | .................... | G02B 5/1842 |
| | | | | 359/567 |
| 2017/0235239 A1* | 8/2017 | Shimizu | ................ | G03F 9/7042 |
| | | | | 264/406 |

\* cited by examiner

IMPRINT TEMPLATE, DETECTION METHOD AND DETECTION DEVICE

CROSS-REFERENCE TO RELATED APPLICATIONS

This application claims a priority to Chinese Patent Application No. 201610591504.4 filed on Jul. 25, 2016, the disclosures of which are incorporated herein in their entirety by reference.

TECHNICAL FIELD

The present disclosure relates to the field of imprint technology, and in particular to an imprint template, a detection method and a detection device.

BACKGROUND

With the development of semiconductor devices towards continuously reduced characteristic sizes, technological advances have lead to exponential increase in terms of the cost of the devices. As a result of the increase in terms of the cost, people are paying more and more attentions to nanoimprint lithography for pattern transfer with low cost. By avoiding the use of expensive light sources and projection optical systems, the nanoimprint lithography makes the cost significantly reduced as compared with the traditional lithography.

The nanoimprint lithography was first studied by professor Stephen Y. Chou at the Nano Structure Laboratory of Princeton University, who imprinted and copied nanometer patterns onto a silicon substrate coated with a polymer material with a mechanical force (high temperature, high pressure) by using a template having the nanometer patterns. The processing resolution of this technology is only related to sizes of the template patterns, and is not physically limited by the shortest exposure wavelength of optical lithography. At present, this technology has been used to produce a pattern with a line width below 5 nm. Due to the elimination of the use of optical lithographic mask plates and optical imaging devices, the nanoimprint lithography has economic advantages of low lost and high throughout.

However, at present, the uniformity of nanoimprinting has become a key issue in whether this technology can be extended in a large scale. Due to the miniaturization of the pattern scale, when the pitch (line width) is in the range of a nanometer scale, it is very important to monitor and detect the uniformity.

SUMMARY

An object of the present disclosure is to provide a solution for detecting quality of a nanometer scale imprint pattern.

To achieve this object, in one aspect, the present disclosure provides in an embodiment an imprint template that includes a first region and a second region located in the periphery of the first region;

wherein the first region is provided with a first imprint structure configured to imprint a first film layer pattern into a base material in a product region of a target substrate; and the second region is provided with a second imprint structure configured to imprint a second film layer pattern into the base material in the periphery of the product region of the target substrate, the second film layer pattern being used for assessing imprint quality of the first film layer pattern.

Optionally, the first imprint structure has a first imprint pattern corresponding to the first film layer pattern, and the second imprint structure has a second imprint pattern corresponding to the second film layer pattern; and the first imprint pattern has a groove depth smaller than that of the second imprint pattern.

Optionally, the pattern imprinted by the second imprint structure has an area larger than that of the pattern imprinted by the first imprint structure.

Optionally, areas of cross-sections of the second imprint pattern are gradually reduced in a depth direction of the second imprint pattern.

Optionally, the second imprint pattern is of a cone shape.

In another aspect, the present disclosure provides a method for detecting imprint quality, applied to a target substrate imprinted by using an imprint template as described above, including steps of:

measuring shape data of the second film layer pattern on the target substrate;

determining a completion degree of imprinting the second film layer pattern based on the measured shape data; and assessing the imprint quality of the first film layer pattern in the product region of the target substrate based on the completion degree of imprinting the second film layer pattern.

Optionally, the first imprint structure of the imprint template has a first imprint pattern corresponding to the first film layer pattern, and the second imprint structure of the imprint template has a second imprint pattern corresponding to the second film layer pattern, and the first imprint pattern has a groove depth smaller than that of the second imprint pattern;

the shape data is the height of the second film layer pattern;

the step of determining the completion degree of imprinting the second film layer pattern based on the measured shape data comprises: comparing the measured height of the second film layer pattern with the groove depth of the second imprint pattern to determine the completion degree of imprinting the second film layer pattern.

Optionally, areas of cross-sections of the second imprint pattern are gradually reduced in a depth direction of the second imprint pattern of the imprint template;

the shape data is an area of a cross-section of a top portion of the second film layer pattern;

the step of determining the completion degree of imprinting the second film layer pattern based on the measured shape data comprises: comparing the measured area of the cross-section of the top portion of the second film layer pattern with an opening area of the second imprint pattern to determine the completion degree of imprinting the second film layer pattern.

Optionally, the step of assessing the imprint quality of the first film layer pattern in the product region of the target substrate based on the completion degree of imprinting the second film layer pattern comprises: determining the imprint quality of the first film layer pattern in the product region of the target substrate is acceptable if the completion degree of imprinting the second film layer pattern reaches a target threshold, or determining the imprint quality of the first film layer pattern in the product region of the target substrate is unacceptable.

Further, the present disclosure provides a device for detecting imprint quality, applied to a target substrate imprinted by using an imprint template as described above, the device comprising:

a measuring circuit configured to measure shape data of the second film layer pattern on the target substrate;

a determining circuit configured to determine a completion degree of imprinting the second film layer pattern based on the measured shape data; and an assessing circuit configured to assess the imprint quality of the first film layer pattern in the product region of the target substrate based on the completion degree of imprinting the second film layer pattern.

Optionally, the first imprint structure of the imprint template has a first imprint pattern corresponding to the first film layer pattern, and the second imprint structure of the imprint template has a second imprint pattern corresponding to the second film layer pattern, and the first imprint pattern has a groove depth smaller than that of the second imprint pattern;

the shape data is the height of the second film layer pattern;

the determining circuit comprises:

a first determining circuit configured to compare the measured height of the second film layer pattern with the groove depth of the second imprint pattern to determine the completion degree of imprinting the second film layer pattern.

Optionally, areas of cross-sections of the second imprint pattern are gradually reduced in a depth direction of the second imprint pattern;

the shape data is an area of a cross-section of a top portion of the second film layer pattern;

the determining circuit comprises:

a second determining circuit configured to compare the measured area of the cross-section of the top portion of the second film layer pattern with an opening area of the second imprint pattern to determine the completion degree of imprinting the second film layer pattern.

Optionally, the assessing circuit is configured to determine the imprint quality of the first film layer pattern in the product region of the target substrate is acceptable if the completion degree of imprinting the second film layer pattern reaches a target threshold, or determine the imprint quality of the first film layer pattern in the product region of the target substrate is unacceptable.

Optionally, both the first imprint pattern and the second imprint pattern are hyperfine nanometer scale imprint patterns.

The above technical solutions of the present disclosure produce the following advantageous effects:

In the solutions of the present disclosure, the imprint quality of the first film layer pattern can be assessed by detecting the second film layer pattern. Since the second film layer pattern is not a product pattern of the substrate, the product quality of the substrate may not be affected even if damage is caused to the second film layer pattern during the measurement, and this is quite suitable for assessing hyperfine nanometer scale imprint patterns.

LIST OF REFERENCE SIGNS

11: first region of imprint template; 12: second region of imprint template; 13: first imprint structure; 14: second imprint structure; 21: first film layer pattern imprinted by first imprint structure; 22: second film layer pattern imprinted by second imprint structure; 23: base material on substrate to be imprinted; 6: substrate; 61: product region.

DETAILED DESCRIPTION

In order to make the technical problem to be solved, technical solutions and advantages of the present disclosure more clearly, the present disclosure will be described below in detail in conjunction with the accompanying drawings and specific embodiments.

The present disclosure provides a solution for detecting quality of a nanometer scale imprint product.

In one aspect, the present disclosure provides an imprint template including a first region 11 and a second region 12 located in the periphery of the first region 11.

The first region 11 is provided with a first imprint structure 13 configured to imprint a first film layer pattern into a base material in a product region of a target substrate. And the second region 12 is provided with a second imprint structure 14 configured to imprint a second film layer pattern into the base material in the periphery of the product region of the target substrate.

Figure 1:
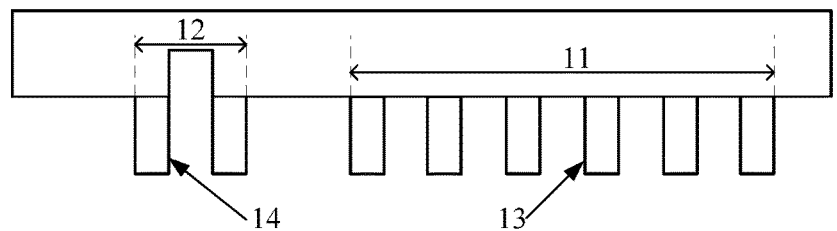
FIG. 1 is a structural schematic view of an imprint template according to an embodiment of the present disclosure.
Figure 2:
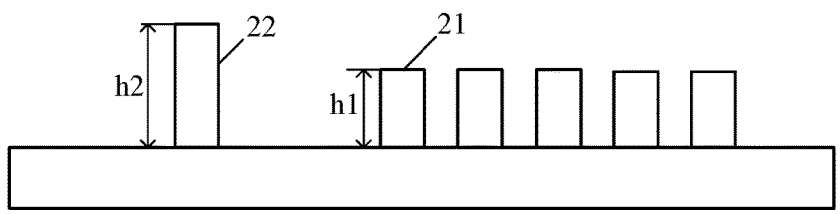
FIG. 2 is a schematic view of structures formed on a substrate after imprinting the substrate by using the imprint template shown in FIG. 1.

As an example, a substrate structure shown in FIG. 2 may be finally formed on the substrate by using the imprint template as shown in FIG. 1. In FIG. 2, the substrate includes a first film layer pattern 21 in the product region and a second film layer pattern 22 in the periphery of the product region.

It is clear that, based on the design of this embodiment, the second film layer pattern may be substituted for the first film layer pattern to be detected. As a result, the damage to the first film layer pattern which is a part of the substrate product can be avoided during the measurement, thus resulting in an improvement in terms of the ratio of fine substrate products.

In a practical application, as shown in FIG. 1, the first imprint structure 11 in this embodiment has a first imprint pattern corresponding to the first film layer pattern, and the second imprint structure 12 has a second imprint pattern corresponding to the second film layer pattern. The second imprint pattern 12 has a groove depth larger than that of the first imprint pattern, thus making it possible to ensure that the second film layer pattern 22 has a height h2 larger than a height h1 of the first film layer pattern 21 after completing the imprinting process, as shown in FIG. 2.

As can be appreciated, based on the above-described structural design, when the second film layer pattern 22 can be completely imprinted, the first film layer pattern 21 are also necessarily able to be completely imprinted. Based on this feature, during the detection, whether the imprinted first film layer pattern 21 is acceptable may be determined so long as a completion degree of the second imprint pattern 22 is determined.

The imprint template of this embodiment will be introduced below in conjunction with one embodiment.

Figure 3:
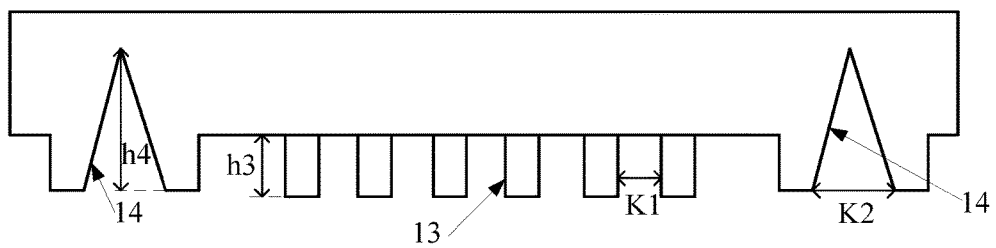
FIG. 3 is a detailed structural view of the imprint template according to an embodiment of the present disclosure.

Referring to FIG. 3, in this embodiment, the imprint template includes a first imprint structure 13 and a second imprint structure 14. The first imprint structure 13 corresponds to a product region of a substrate, and the second imprint structure 14 is provided in the periphery of the product region.

The second imprint pattern corresponding to the second imprint structure 14 has a groove depth h4 larger than a groove depth h3 of the first imprint pattern corresponding to the first imprint structure, and an opening area K2 of a groove of the second imprint pattern is also larger than an opening area K1 of a groove of the first imprint pattern. Thus, the pattern imprinted by the second imprint structure has an area larger than that of the pattern imprinted by the first imprint structure. Based on this structural design, after completing the imprinting process, the second film layer pattern formed on the substrate has a larger size than the first film layer pattern so as to facilitate subsequent detection process.

Figure 4:
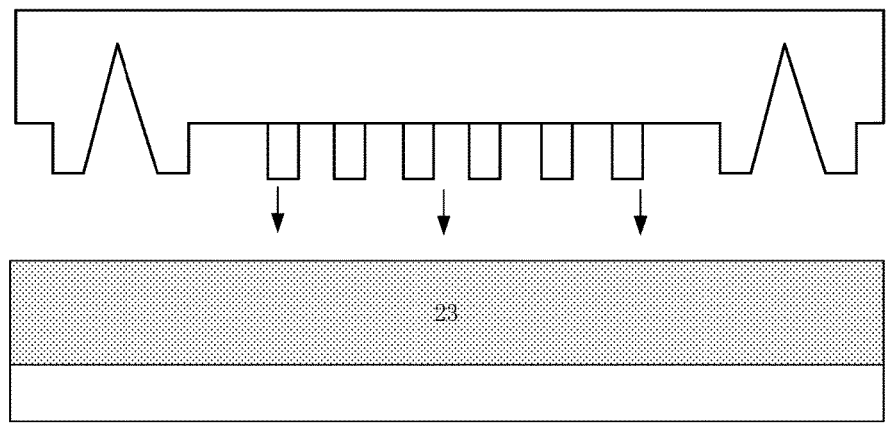
FIG. 4 is a schematic view showing the imprinting of the substrate by using the imprint plate shown in FIG. 3.
Figure 5:
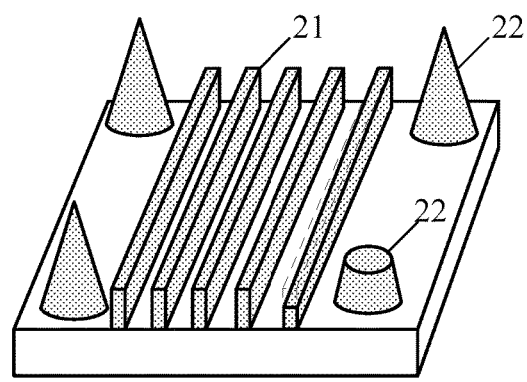
FIG. 5 is a schematic view of structures formed on a substrate after imprinting the substrate by using the imprint template shown in FIG. 3.

During the imprinting process, referring to FIG. 4, the imprint template shown in FIG. 3 is used to imprint a substrate coated with a base material 23 such that a structure shown in FIG. 5 is finally formed on the substrate, which includes a first film layer pattern 21 imprinted by the first imprint structure 13 and a second film layer pattern 22 imprinted y the second imprint structure 14.

As can be appreciated from the foregoing description, if the second film layer pattern 22 is completely imprinted, a cone-shaped structure will be formed. As an example, if only the second film layer pattern 22 in the lower right part of FIG. 5 is not completely imprinted, it can be determined in this embodiment that the first film layer pattern 21 located close to this position is not completely imprinted either.

Corresponding to the above solution, the present disclosure provides in another embodiment a method for detecting imprint quality, applied to a target substrate imprinted by using the imprint template as described above, the method including steps of:

Step S1: measuring shape data of the second film layer pattern on the target substrate;

Step S2: determining a completion degree of imprinting the second film layer pattern based on the measured shape data; and Step S3: assessing the imprint quality of the first film layer pattern in the product region of the target substrate based on the completion degree of imprinting the second film layer pattern.

Specifically, it is only required to detect a completion degree of imprinting the second film layer pattern in the detection method of this embodiment in order to assess the imprint quality of the first film layer pattern in the product region. In a practical application, the second film layer pattern may be made to have a larger volume so as to facilitate the measurement of the shape data. During the detection process, the damage to the second film layer pattern will not cause any negative effect on the first film layer pattern in the product region of the substrate. As a result, a high ratio of good-quality substrates can be ensured.

The detection method of this embodiment will be described in detail below.

Illustratively, it is possible to determine the imprint quality of the first film layer pattern based on a height of the second film layer pattern on the substrate in the present disclosure.

Referring to the substrate which has been imprinted as shown in FIG. 5, if only the second film layer pattern 22 in the lower right part is incomplete, the height of the second film layer pattern 22 may be still detected to be compared with the groove depth h4 of the second imprint pattern of the imprint template shown in FIG. 3 (if the second film layer pattern can be completely imprinted, its height value should be close to the groove depth of the second imprint pattern). As an example, if the height of the incomplete second film layer pattern 22 is only half of the groove depth h4 of the second imprint pattern, it can be inferred that the completion degree of the incomplete second film layer pattern 22 is only 50%. In other words, when this position is imprinted by using the imprint template, the applied force at this position is lower than that in other positions.

If we assume that when a force applied to the imprint template for imprinting is just enough to imprint a complete first film layer pattern 21, the corresponding completion degree of the second film layer pattern 22 is 60%, then this completion degree 60% may be used as an assessment criterion for determining the imprint quality of the first film layer pattern 21.

In a practical application, 60% may be used as a preset standard threshold. Since the completion degree of the second film layer pattern 22 in FIG. 4 is only 50% which is lower than the standard threshold 60%, it can be determined that the first film layer pattern 21 close to this second film layer pattern is not completely imprinted. In this case, it can be directly determined that the imprint quality of the first film layer pattern 21 on the substrate is unacceptable.

For the same reasons, if when a complete first film layer pattern 21 is just imprinted by using the imprint template, a completion degree of the second film layer pattern 22 is 40%, this completion degree 40% may be used as a preset standard threshold for determining the imprint quality of the first film layer pattern 21. Referring to FIG. 5, even if the completion degree of the second film layer pattern 22 in the right lower corner is only half of the normal one, but is still higher than the standard threshold 40%, it means that the first film layer pattern close to this second film layer pattern is completely imprinted. In this case, it can be directly determined that the imprint quality of the first film layer pattern is acceptable.

In addition, in another optional detection process of the present disclosure, it is possible to determine the imprint quality of the first film layer pattern based on a cross-section area of a top portion of the second film layer pattern on the substrate.

For the same reasons, in this embodiment, a cross-section area of a top portion of an incomplete second film layer pattern 22 may be measured first, and then compared with an opening area K2 of the second imprint pattern shown in FIG. 3. It is clear that, this ratio can also reflect the completion degree of the incomplete second film layer pattern.

Thereafter, the imprint quality of the first film layer pattern may be further assessed based on the determined completion degree of the second film layer pattern.

Thus, the imprint template and the detection method in the embodiments of the present disclosure have at least one of the following advantageous effects:

1) When the first film layer pattern is of a nanometer scale structure, it is difficult to measure the completion degree of imprinting it. However, in the embodiments of the present disclosure, the completion degree of imprinting the first film layer pattern can be indirectly deduced from the completion degree of imprinting the second film layer pattern. Therefore, the second film layer pattern can be made to have a larger volume so as to facilitate the measurement during the detection process.

2) In a practical application, it is possible to measure the shape data of the second film layer pattern by using a measuring tool, especially those which may need to make some physical contact with the second film layer pattern in order to perform the measurement. Since the second film layer pattern is not a part of the substrate product, the first film layer pattern in the product region may not be affected adversely even if the second film layer pattern is damaged during its contact with the measuring tool.

Figure 6:
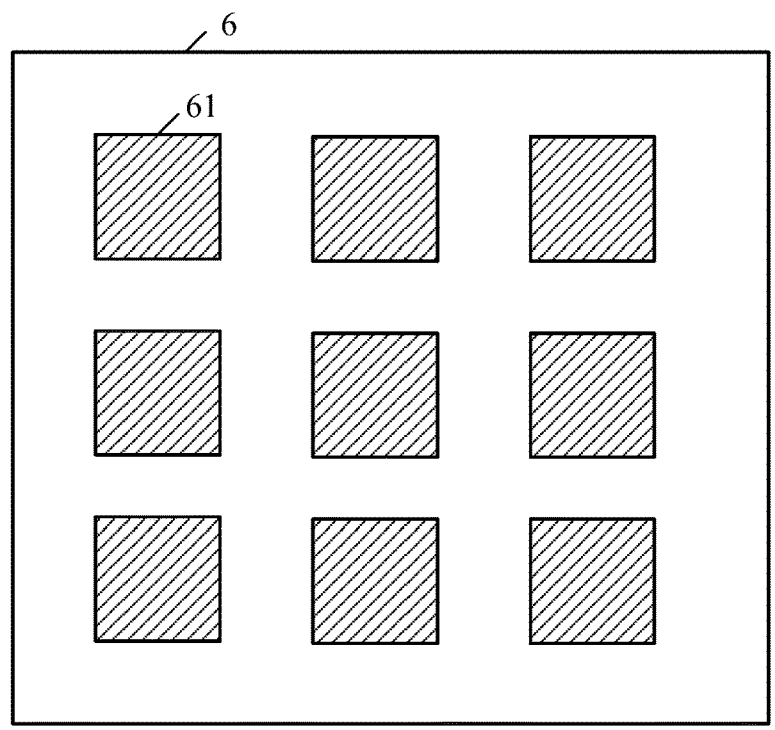
FIG. 6 is a structural schematic view of a substrate according to an embodiment of the present disclosure.

3) As shown in FIG. 6, in practical production, a substrate includes a plurality of product regions to be imprinted. In general, these product regions are finally required to be cut into separate products. It is clear that, before the cutting procedure, the product regions on the substrate may be spaced apart from one another at a certain interval, and the positions therebetween are positions that need to be imprinted with the second film layer pattern by using the imprint template in the present disclosure. Thus, there is no need to make modifications to the side of the substrate in the technical solutions provided in the embodiments of the present disclosure, and only the existing space on the substrate is used. As a result, the whole solution can be easily implemented in a practical production line.

Figure 7:
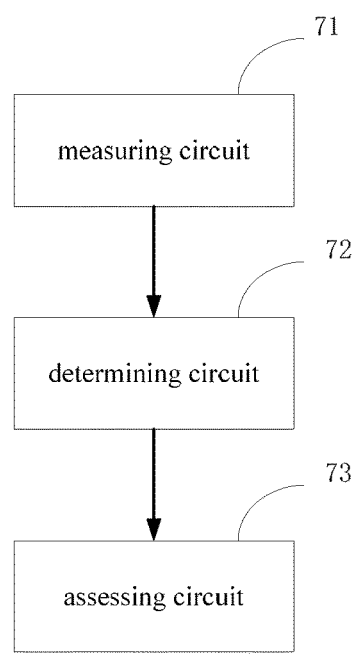
FIG. 7 is a structural schematic view of a detection device according to an embodiment of the present disclosure.

Moreover, the present disclosure provides in another embodiment a device for detecting imprint quality, applied to a target substrate imprinted by using the imprint template provided in the foregoing embodiment of the present disclosure. As shown in FIG. 7, the detection device in this embodiment includes:

a measuring circuit 71 configured to measure shape data of the second film layer pattern on the target substrate;

a determining circuit 72 configured to determine a completion degree of imprinting the second film layer pattern based on the measured shape data; and an assessing circuit 73 configured to assess the imprint quality of the first film layer pattern in the product region of the target substrate based on the completion degree of imprinting the second film layer pattern.

Specifically, the detection device of this embodiment is only required to detect the completion degree of the second film layer pattern in order to assess the imprint quality of the first film layer pattern in the product region. In a practical application, the second film layer may be made to have a larger volume so as to facilitate the measurement of the shape data. Moreover, during the detection, the damage to the second film layer pattern will not cause any adverse effect on the first film layer pattern in the product region of the substrate, thereby ensuring the high ratio of good-quality substrates.

Specifically, it is possible to assess the imprint quality of the first imprint pattern based on a height of the imprinted second film layer pattern.

The first imprint structure of the imprint template has a first imprint pattern corresponding to the first film layer pattern, and the second imprint structure of the imprint template has a second imprint pattern corresponding to the second film layer pattern. And the first imprint pattern has a groove depth smaller than that of the second imprint pattern.

During the detection process, the measuring circuit 71 measures the height of the second film layer pattern.

The determining circuit 72 includes a first determining circuit (not shown) configured to compare the measured height of the second film layer pattern with the groove depth of the second imprint pattern so as to determine the completion degree of the second film layer pattern.

Then, the assessing circuit 73 determines the imprint quality of the first film layer pattern based on the completion degree of the second film layer pattern.

Alternatively, it is possible to assess the quality of the first imprint pattern based on a cross-section area of a top portion of the imprinted second film layer pattern in this embodiment.

In this embodiment, areas of cross-sections of the second imprint pattern are gradually reduced in a depth direction of the second imprint pattern.

During the detection process, the measuring circuit 71 measures the area of the cross-section of the top portion of the second film layer pattern.

The determining circuit 72 includes a second determining circuit (not shown) configured to compare the area of the cross-section of the top portion of the second film layer pattern with an opening area of the second imprint pattern so as to determine the completion degree of the second film layer pattern.

Thereafter, the assessing circuit 73 determines the imprint quality of the first film layer pattern based on the completion degree of imprinting the second film layer pattern.

In this embodiment, a target threshold may be set for the completion degree of imprinting the second film layer pattern, and the target threshold is the completion degree of imprinting the second film layer pattern in the case where a complete first film layer pattern can be just imprinted.

In this embodiment, if an actual completion degree of imprinting the second film layer pattern on the substrate reaches the target threshold, the assessing circuit 73 may determine that the imprint quality of the first film layer pattern in the product region of the target substrate is acceptable. Otherwise, if the actual completion degree of imprinting the second film layer pattern on the substrate fails to reach the target threshold, the assessing circuit 73 may determine that the imprint quality of the first film layer pattern in the product region of the target substrate is unacceptable.

Based on the principle of this embodiment, in a practical application of the embodiment of the present disclosure, the assessing circuit 73 is not limited to assessing whether the imprint quality of the first film layer pattern is acceptable or not, but also can determine a distribution state of pressures during the imprinting process. That is, the uniformity of the pressures during the imprinting process can be further assessed based on the completion degree of the second film layer pattern on the target substrate. For example, after completing the imprinting process, the completion degree of the second film layer pattern on one side of the target substrate is between 57% and 65%, and the completion degree of the second film layer pattern on the other side is between 15% and 25%. Apparently, the side where the completion degree of the second film layer pattern is higher has been subjected to a higher pressure during the imprinting process. That is, it reflects the failure condition of the imprinting device, and the assessing circuit 73 may provide this result of analysis to related technicians as a warning, so as to enable the technicians to check the imprint device in time.

It is clear that, the detection device of this embodiment corresponds to the method for detecting the imprint quality of the embodiment of the present disclosure, and thus can produce the same technical effects.

The above are the preferred embodiments of the present disclosure, and it shall be indicated that a person skilled in the art may make modifications and improvements without departing from the principle of the present disclosure, and such modifications and improvements should be regarded as falling within the protection scope of the present disclosure.

What is claimed is:

1. An imprint plate, comprising:
a first region;
a second region located in the periphery of the first region;
a first imprint structure provided in the first region and configured to imprint a first film layer pattern into a base material in a product region of a target substrate; and
a second imprint structure provided in the second region and configured to imprint a second film layer pattern into the base material in the periphery of the product region of the target substrate, the second film layer pattern being used for assessing imprint quality of the first film layer pattern,
wherein whether or not the first film layer pattern is to be imprinted completely is determined based on that the second film layer pattern has been already imprinted completely.

2. The imprint template according to claim 1, wherein the first imprint structure has a first imprint pattern corresponding to the first film layer pattern, and the second imprint structure has a second imprint pattern corresponding to the second film layer pattern; and
the second imprint pattern has a groove depth larger than that of the first imprint pattern.

3. The imprint template according to claim 2, wherein the pattern imprinted by the second imprint structure has an area larger than that of the pattern imprinted by the first imprint structure.

4. The imprint template according to claim 3, wherein areas of cross-sections of the second imprint pattern are gradually reduced in a depth direction of the second imprint pattern.

5. The imprint template according to claim 3, wherein the second imprint pattern is of a cone shape.

6. The imprint template according to claim 2, wherein areas of cross-sections of the second imprint pattern are gradually reduced in a depth direction of the second imprint pattern.

7. The imprint template according to claim 2, wherein the second imprint pattern is of a cone shape.

8. A method for detecting imprint quality, applied to a target substrate imprinted by using an imprint template, wherein the imprint template comprises: a first region; a second region located in the periphery of the first region; a first imprint structure provided in the first region and configured to imprint a first film layer pattern into a base material in a product region of the target substrate; and a second imprint structure provided in the second region and configured to imprint a second film layer pattern into the base material in the periphery of the product region of the target substrate, the second film layer pattern being used for assessing imprint quality of the first film layer pattern, wherein whether or not the first film layer pattern is to be imprinted completely is determined based on that the second film layer pattern has been already imprinted completely,
the method comprising steps of:
measuring shape data of the second film layer pattern on the target substrate;
determining a completion degree of imprinting the second film layer pattern based on the measured shape data; and
assessing the imprint quality of the first film layer pattern in the product region of the target substrate based on the completion degree of imprinting the second film layer pattern.

9. The method according to claim 8, wherein the first imprint structure of the imprint template has a first imprint pattern corresponding to the first film layer pattern, and the second imprint structure of the imprint template has a second imprint pattern corresponding to the second film layer pattern, and the second imprint pattern has a groove depth larger than that of the first imprint pattern;
the shape data is the height of the second film layer pattern;
the step of determining the completion degree of imprinting the second film layer pattern based on the measured shape data comprises:
comparing the measured height of the second film layer pattern with the groove depth of the second imprint pattern to determine the completion degree of imprinting the second film layer pattern.

10. The method according to claim 9, wherein the step of assessing the imprint quality of the first film layer pattern in the product region of the target substrate based on the completion degree of imprinting the second film layer pattern comprises:
determining the imprint quality of the first film layer pattern in the product region of the target substrate is acceptable if the completion degree of imprinting the second film layer pattern reaches a target threshold, or determining the imprint quality of the first film layer pattern in the product region of the target substrate is unacceptable.

11. The method according to claim 8, wherein areas of cross-sections of the second imprint pattern are gradually reduced in a depth direction of the second imprint pattern;
the shape data is an area of a cross-section of a top portion of the second film layer pattern;
the step of determining the completion degree of imprinting the second film layer pattern based on the measured shape data comprises:
comparing the measured area of the cross-section of the top portion of the second film layer pattern with an opening area of the second imprint pattern to determine the completion degree of imprinting the second film layer pattern.

12. The method according to claim 11, wherein the step of assessing the imprint quality of the first film layer pattern in the product region of the target substrate based on the completion degree of imprinting the second film layer pattern comprises:
determining the imprint quality of the first film layer pattern in the product region of the target substrate is acceptable if the completion degree of imprinting the second film layer pattern reaches a target threshold, or determining the imprint quality of the first film layer pattern in the product region of the target substrate is unacceptable.

13. The method according to claim 8, wherein the step of assessing the imprint quality of the first film layer pattern in the product region of the target substrate based on the completion degree of imprinting the second film layer pattern comprises:
determining the imprint quality of the first film layer pattern in the product region of the target substrate is acceptable if the completion degree of imprinting the second film layer pattern reaches a target threshold, or determining the imprint quality of the first film layer pattern in the product region of the target substrate is unacceptable.

14. A device for detecting imprint quality, applied to a target substrate imprinted by using an imprint template, wherein the imprint template comprises a first region; a second region located in the periphery of the first region; a first imprint structure provided in the first region and configured to imprint a first film layer pattern into a base material in a product region of a target substrate; and a second imprint structure provided in the second region and configured to imprint a second film layer pattern into the base material in the periphery of the product region of the target substrate, the second film layer pattern being used for assessing imprint quality of the first film layer pattern,
the device comprising:
a measuring circuit configured to measure shape data of the second film layer pattern on the target substrate;
a determining circuit configured to determine the completion degree of imprinting the second film layer pattern based on the measured shape data; and
an assessing circuit configured to assess the imprint quality of the first film layer pattern in the product region of the target substrate based on the completion degree of imprinting the second film layer pattern,
wherein whether or not the first film layer pattern is to be imprinted completely is determined based on that the second film layer pattern has been already imprinted completely.

15. The device according to claim 14, wherein the first imprint structure of the imprint template has a first imprint pattern corresponding to the first film layer pattern, and the second imprint structure of the imprint template has a second imprint pattern corresponding to the second film layer pattern, and the second imprint pattern has a groove depth larger than that of the first imprint pattern;
the shape data is the height of the second film layer pattern;
the determining circuit comprises:
a first determining circuit configured to compare the measured height of the second film layer pattern with the groove depth of the second imprint pattern to determine the completion degree of imprinting the second film layer pattern.

16. The device according to claim 15, wherein the assessing circuit is configured to determine the imprint quality of the first film layer pattern in the product region of the target substrate is acceptable if the completion degree of imprinting the second film layer pattern reaches a target threshold, or determine the imprint quality of the first film layer pattern in the product region of the target substrate is unacceptable.

17. The device according to claim 15, wherein both the first imprint pattern and the second imprint pattern are hyperfine nanometer scale imprint patterns.

18. The device according to claim 14, wherein areas of cross-sections of the second imprint pattern are gradually reduced in a depth direction of the second imprint pattern;
the shape data is an area of a cross-section of a top portion of the second film layer pattern;
the determining circuit comprises:
a second determining circuit configured to compare the measured area of the cross-section of the top portion of the second film layer pattern with an opening area of the second imprint pattern to determine the completion degree of imprinting the second film layer pattern.

19. The device according to claim 18, wherein the assessing circuit is configured to determine the imprint quality of the first film layer pattern in the product region of the target substrate is acceptable if the completion degree of imprinting the second film layer pattern reaches a target threshold, or determine the imprint quality of the first film layer pattern in the product region of the target substrate is unacceptable.

20. The device according to claim 14, wherein the assessing circuit is configured to determine the imprint quality of the first film layer pattern in the product region of the target substrate is acceptable if the completion degree of imprinting the second film layer pattern reaches a target threshold, or determine the imprint quality of the first film layer pattern in the product region of the target substrate is unacceptable.

* * * * *